United States Patent [19]

Juskey et al.

[11] Patent Number: 5,218,759
[45] Date of Patent: Jun. 15, 1993

[54] METHOD OF MAKING A TRANSFER MOLDED SEMICONDUCTOR DEVICE

[75] Inventors: Frank J. Juskey; Lonnie L. Bernardoni, both of Coral Springs; Bruce J. Freyman, Plantation; Anthony B. Suppelsa, Coral Springs, all of Fla.

[73] Assignee: Motorola, Inc., Schaumburg, Ill.

[21] Appl. No.: 670,663

[22] Filed: Mar. 18, 1991

[51] Int. Cl.$^5$ ............... B29C 45/14; H05K 3/28; H05K 3/34
[52] U.S. Cl. .................. 29/840; 29/841; 29/843; 264/272.15; 264/272.17; 156/246; 156/247
[58] Field of Search ............ 264/272.11, 272.15, 264/272.17, 279.1, 264, 275, 279; 29/840, 841, 843; 156/242, 245, 246, 247

[56] References Cited

U.S. PATENT DOCUMENTS

| | | | |
|---|---|---|---|
| 3,688,396 | 9/1972 | Kilby et al. | 264/272.17 |
| 4,460,537 | 7/1984 | Heinle | 264/272.17 |
| 4,514,752 | 4/1985 | Engel et al. | 264/272.17 |
| 4,711,688 | 12/1987 | Pienimaa | 264/272.17 |
| 4,812,421 | 3/1989 | Jung et al. | 264/272.11 |
| 4,822,550 | 4/1989 | Komathu | 264/263 |
| 4,843,036 | 6/1989 | Schmidt et al. | 264/272.11 |
| 4,927,580 | 5/1990 | Nasu et al. | 264/272.17 |
| 4,942,140 | 7/1990 | Ootsuki et al. | 264/272.11 |
| 4,997,355 | 3/1991 | Yamaguchi et al. | 264/272.17 |

FOREIGN PATENT DOCUMENTS

| | | | |
|---|---|---|---|
| 59-093315 | 5/1984 | Japan | 264/272.17 |
| 62-105610 | 5/1987 | Japan | 264/272.11 |
| 62-176136 | 8/1987 | Japan | 264/272.17 |
| 2086134 | 5/1982 | United Kingdom | 264/272.17 |

Primary Examiner—Jan H. Silbaugh
Assistant Examiner—Angela Ortiz
Attorney, Agent, or Firm—Dale W. Dorinski

[57] ABSTRACT

A method of making a pad array chip carrier package is disclosed. A semiconductor device (10) is bonded to a ceramic substrate (12). The semiconductor device may be attached to the substrate by wirebonding, tab bonding or flip chip bonding. The bonded assembly (16) is then attached to a flexible temporary support substrate (18) by means of an adhesive (19). The entire assembly is then placed into a mold cavity (20 and 22) and registered against the temporary support substrate (18). Plastic material (30) is molded about the semiconductor device and associated wirebonds in order to encapsulate the device. After removal from the mold, the encapsulated assembly is removed from the temporary support substrate (18) by peeling the temporary support substrate (18) from the circuit substrate.

19 Claims, 2 Drawing Sheets

METHOD OF MAKING A TRANSFER MOLDED SEMICONDUCTOR DEVICE

TECHNICAL FIELD

This invention relates generally to packages for semiconductor devices, and most particularly to a method of transfer molding leadless semiconductor packages.

BACKGROUND

Pad grid array packages are becoming a popular form of integrated circuit packaging; as they provide for a large number of pads in a small package. Pad grid arrays are formed by mounting a semiconductor device on a substrate containing an array of pads on the bottom of the substrate. The substrate is registered in a mold cavity by locating the edges of the substrate against registration bumps in the mold cavity. A plastic material is then transfer-molded about the semiconductor device to form a completed package. After the molding is completed, the registration bumps appear in the finished pad grid array package as indentations or ribs.

Some pad grid array assemblies are made from low-cost materials such as epoxy-glass or polyester-glass printed circuit board substrates. The fabrication of these substrates shares most of the same assembly processes and techniques with conventional printed circuit board manufacturing processes. Other types of pad grid array assemblies employ alumina ceramic substrates that more closely match the expansion co-efficient of the semiconductor device, but these substrates are more fragile than the printed circuit board substrates. Similar substrate materials such as aluminum nitride or beryllium oxide are also useful as substrate materials due to their attractive thermal conductivity and electrical properties. However, all these ceramic materials are too fragile to be used in a transfer molded package. During the molding operation the high clamping pressure exerted on the substrate by the mold press fractures the fragile substrates.

Another problem experienced in transfer molding is the need for a dedicated mold tool for each size of semiconductor device used. As the size of the device and substrate changes, the sizes of the openings and registration bumps in the mold cavity must change in order to accommodate the various sizes. In laboratory or pilot plant situations where a large number of different sized semiconductors are being molded, the inventory of mold sizes becomes excessive, and the time required to change the mold cavities becomes prohibitive. It would be desirable to have a method of making a pad array chip carrier that only uses a single mold cavity that would accommodate a number of different size semiconductors and substrates, and would also be able to be used in molding a package made with a fragile ceramic substrate.

SUMMARY OF THE INVENTION

Briefly, according to the invention, a method of making a pad array chip carrier package on a fragile substrate is provided. A semiconductor device is electrically and mechanically connected to one side of a circuit carrying substrate. The other side of the circuit carrying substrate is then attached to a temporary support substrate that is larger than the circuit carrying substrate, in order to form a temporary assembly. The assembly is placed in a mold cavity and the semiconductor device and substantially all of the first side of the circuit carrying substrate is encapsulated. After removing the molded assembly from the mold cavity, the temporary support substrate is removed from the circuit carrying substrate.

DETAILED DESCRIPTION OF THE PREFERRED EMBODIMENT

Figure 1:
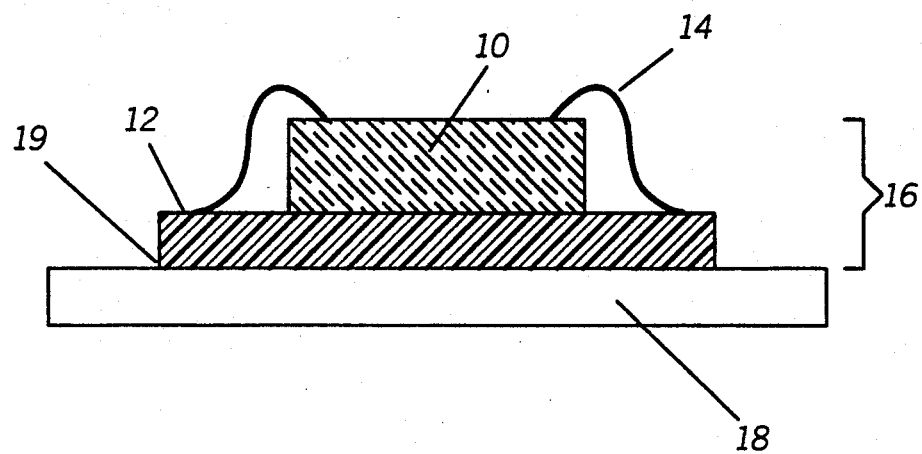
FIG. 1 is a cross-sectional view of a semiconductor device and substrate bonded to a temporary support substrate in accordance with the present invention.

Referring to FIG. 1, a semiconductor device 10 is mounted on a circuit carrying substrate 12, and electrically connected to the substrate by means of wirebonds 14. The semiconductor device 10 may also be attached to the substrate by TAB or flip-chip bonding. The substrate 12 is typically alumina ceramic ($AL_2O_3$), aluminum nitride (AlN), or beryllium oxide (BeO), or alternatively may be a low cost material such as epoxy glass, polyester glass or flexible printed circuit board materials. The assembly 16 (comprising the semiconductor device wirebonded to the substrate) is then attached to a temporary support substrate 18 by means of an adhesive 19. The temporary support substrate may be selected from a wide variety of materials, but is preferably a thin material such as a printed circuit board, flexible film, or metals. The most important criteria for selection of the material for the temporary support substrate are 1) flexible in order that it may be easily removed from the circuit carrying substrate, 2) that it be relatively thin, and 3) relatively low cost. The thickness of the temporary support substrate ranges from about 0.001 inch to about 0.050 inches, with about 0.005 to about 0.015 inches being a preferred range. The temporary support substrate is typically attached to the semiconductor device substrate 12 using an adhesive such as a cyanoacrylate ester adhesive, known commonly as "super glue". One adhesive found to be particularly useful is Loctite SuperBonder 422 from Loctite Corp of Newington Conn. The goal in bonding the substrate 12 to the temporary support substrate 18 is to achieve a temporary bond that can be easily cleaved after the molding operation is complete. Other adhesives, such as pressure sensitive adhesives, high temperature hot-melt adhesives, and epoxy adhesives may be used if the adhesive bond can be easily broken after the molding operation.

Figure 2:
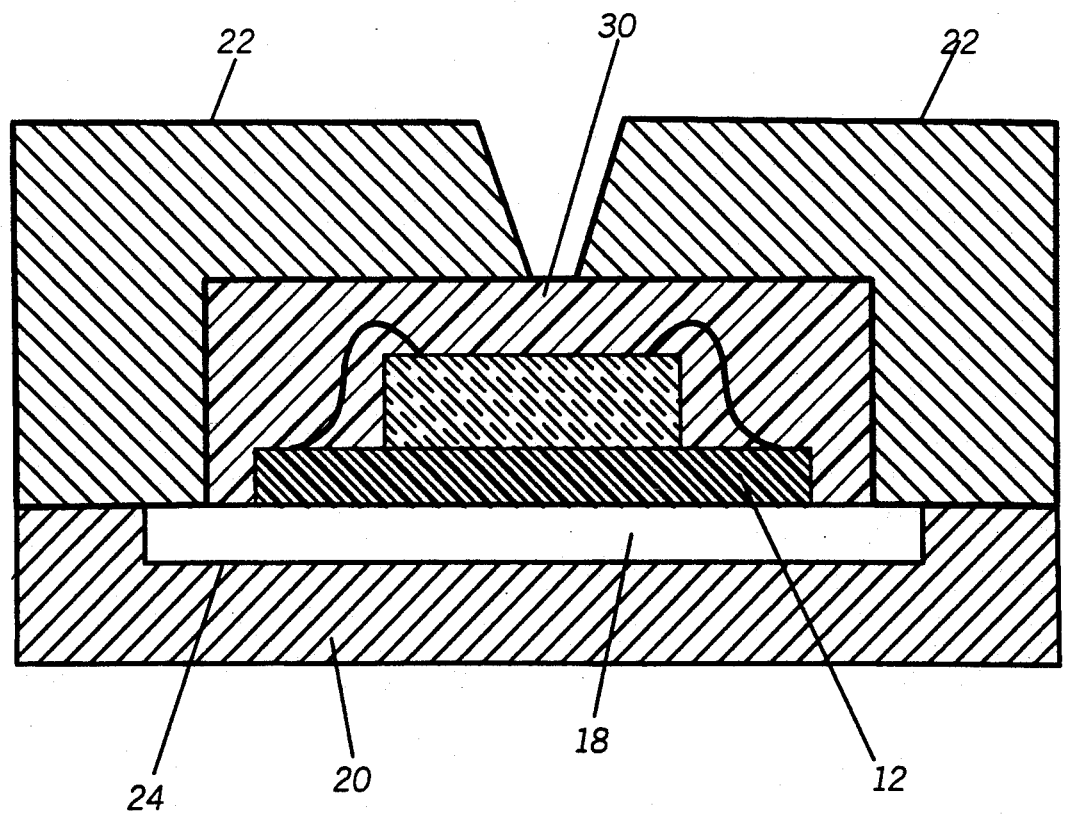
FIG. 2 is the assembly of FIG. 1 mounted in a transfer molding press.
Figure 3:
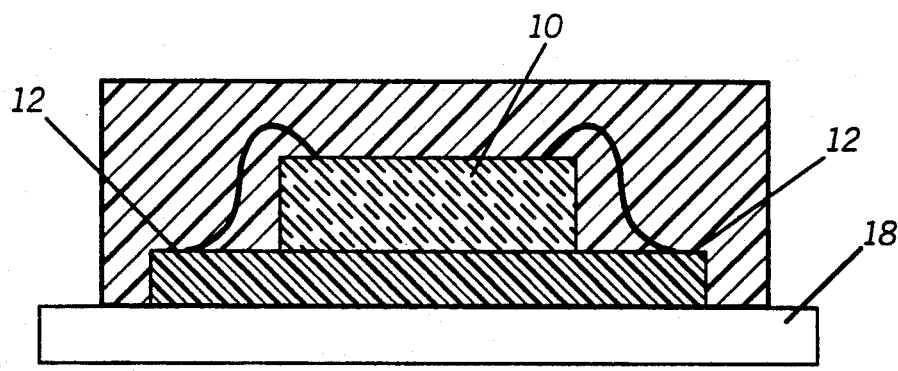
FIG. 3 is the molded assembly after ejection from the mold cavity.

After bonding the circuit carrying substrate to the temporary support substrate, the assembly is transfer-molded using a thermoplastic or thermoset molding compound, preferably a thermoset epoxy. Molding compound encapsulates the semiconductor device and wirebonds, and covers nearly all the top surface of the substrate. Referring now to FIG. 2, the bonded assembly is placed into a mold cavity consisting of a base 20 and an upper half 22. The base 20 contains recesses 24 that serve to locate the position of the assembly in the mold. The temporary support substrate 18 is positioned such that it is registered against portions of the recesses 24 of the mold cavity. The upper portions 22 of the mold cavity then close to clamp the temporary support substrate 18 in place in the mold cavity. It can be seen from the drawing that the use of a temporary support substrate 18 prevents the upper portions 22 of the mold cavity from closing on the circuit carrying substrate 12. By registering the temporary support substrate 18 in the mold cavity 24 and closing the upper mold half 22 on the temporary support substrate 18, stresses and fracturing of the circuit carrying substrate 12 are eliminated. After the mold is closed, a molding material 30 is molded about the semiconductor device, the wirebonds, and most of the upper surfaces of the substrate in order to encapsulate the semiconductor device. The mold is then opened and the part is ejected to reveal a structure as shown in FIG. 3. The semiconductor device 10 and substrate 12 are encapsulated with material, however the temporary support substrate 18 remains exposed. The temporary support substrate 18 is then removed by peeling it away from the circuit carrying substrate to reveal the resulting structure shown in FIG. 4. Methods of removing the temporary support structure are a function of the adhesive selected for bonding the support structure to the semiconductor device substrate 12. If a "Super glue" type of material is used, the temporary substrate may be removed by peeling the support substrate away from the molded assembly. Although materials such as "super glue" have extremely high tensile strength, they tend to have very low peel strength. Thus the assembly can be easily handled and is durable enough to withstand the molding operation, but the temporary support substrate can be easily peeled from the completed assembly. Any adhesive remaining on the ceramic substrate 12 can be easily removed with a solvent such as acetone. If a hot-melt adhesive is used to bond the assembly, the support substrate may be removed by heating the assembly until the adhesive melts and then peeling the substrate away. Other methods of removing the temporary support substrate, such as dissolving or degrading the adhesive bond with chemical materials may also be used, however, the selected chemicals should not cause degradation of the molding compound.

The use of a temporary support substrate provides two additional advantages. The temporary support substrate insures that molding compound does not flash around the edges of the molded package as is a problem with conventional molding procedures. Thus, the bottom of the finished package is always smooth and coplanar, without any flash and without the associated touch-up labor required to remove the flash. In addition, a single sized temporary support substrate may be used with a single size of mold cavity to mold packages that have a wide variety of circuit carrying substrate sizes, since the circuit carrying substrate is not used to register or hold the part in the mold cavity.

Figure 5:
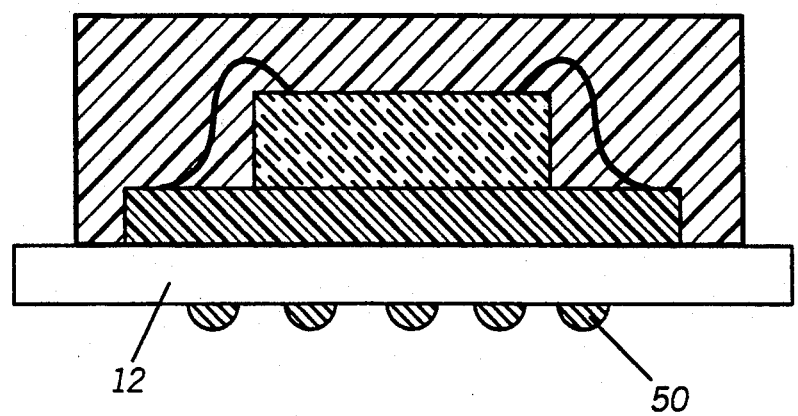
FIG. 5 is a further embodiment of the invention with the solder spheres attached to the solder pads.

In a further embodiment of the invention shown in FIG. 5, solder bumps 50 are attached to the substrate 12 to create an array of bumped solder pads. The use of solder bumps allows the pad array chip carrier to be easily soldered to solder pads on a main circuit board (not shown). The height of the solder bump must be sufficient to effect a surface mount interconnect, typically from about 3 to about 30 mils high, and of about the same diameter as the solder pad.

It can be seen that the use of a temporary support substrate allows the inclusion of fragile materials such as ceramics like aluminum oxide, beryllium oxide and aluminum nitride to be used in producing transfer molded semiconductor devices. The use of a sacrificial temporary support substrate allows a single mold size to be used to mold a number of devices having various sized substrates as opposed to creating a new mold for each substrate size. Therefore, the invention provides the advantages of lower cost and an ability to utilize more exotic and fragile substrates.

Various changes and modifications in the method of manufacturing a pad array chip carrier herein disclosed may occur to those skilled in the art; and to the extent that such changes and modifications are embraced by the appended claims, it is to be understood that they constitute part of the present invention.

What is claimed is:

1. A method of making a pad array chip carrier package, comprising the steps of:
    providing a semiconductor device and a circuit carrying substrate, the circuit carrying substrate having first and second opposed major faces;
    electrically and mechanically mounting the semiconductor device on the first major face of the circuit carrying substrate;
    providing a temporary support substrate;
    attaching the temporary support substrate to the second major face of the circuit carrying substrate;
    molding a protective plastic cover about the semiconductor device and substantially all of the first major face of the circuit carrying substrate; and
    removing the temporary support substrate from the circuit carrying substrate.

2. The method as described in claim 1, wherein the step of attaching the temporary support substrate comprises attaching the temporary support substrate by means of an adhesive.

3. The method as described in claim 1, wherein the step of molding a protective plastic cover further comprises transfer molding the protective plastic cover.

4. The method as described in claim 1, wherein the step of molding a protective plastic cover comprises the technique of injection molding.

5. The method as described in claim 1, wherein the step of molding a protective plastic cover comprises the technique of reaction injection molding.

6. The method as described in claim 1, wherein the step of molding a protective plastic cover comprises molding a protective plastic cover so as to reveal a portion of the first major face of the circuit carrying substrate about a perimeter of the protective plastic cover.

7. The method as described in claim 1, wherein the step of removing the temporary support substrate comprises peeling the temporary support substrate from the circuit carrying substrate.

8. The method as described in claim 1, further comprising a final step of providing solder bumps on a plurality of solderable pads on the second major face of the circuit carrying substrate.

9. The method as described in claim 1, wherein the step of providing a circuit carrying substrate comprises providing a rigid circuit carrying substrate.

10. A method of making a pad array chip carrier package, comprising the steps of:

providing a semiconductor device and a circuit carrying substrate, the circuit carrying substrate having first and second opposed major faces;

electrically and mechanically mounting the semiconductor device on the first major face of the circuit carrying substrate;

providing a temporary support substrate;

attaching the temporary support substrate to the second major face of the circuit carrying substrate forming an assembly;

placing the assembly into a mold cavity such that the assembly is located and supported in the mold cavity by the temporary support substrate;

molding a plastic material about the semiconductor device and substantially all of the first major face of the circuit carrying substrate in order to form a second assembly;

removing the second assembly from the mold cavity; and removing the temporary support substrate from the circuit carrying substrate.

11. The method as described in claim 10, wherein the step of attaching the temporary support substrate comprises attaching the temporary support substrate by means of an adhesive.

12. The method as described in claim 10, wherein the step of molding a plastic material comprises transfer molding.

13. The method as described in claim 10, wherein the step of molding a plastic material comprises injection molding.

14. The method as described in claim 10, wherein the step of molding a plastic material comprises reaction injection molding.

15. The method as described in claim 10, wherein the step of molding a plastic material comprises molding the plastic material so as to reveal a portion of at least the first major face of the circuit carrying substrate.

16. The method as described in claim 10, wherein the step of removing the temporary support substrate comprises peeling the temporary support substrate from the circuit carrying substrate.

17. The method as described in claim 10, further comprising a final step of providing solder bumps on a plurality of solderable pads on the second major face of the circuit carrying substrate.

18. The method as described in claim 10, wherein the step of providing a circuit carrying substrate comprises providing a rigid circuit carrying substrate.

19. A method of making a pad array chip carrier package, comprising the steps of:

providing a semiconductor device and a rigid ceramic circuit carrying substrate, the circuit carrying substrate having first and second opposed major faces;

electrically and mechanically mounting the semiconductor device on the first major face of the circuit carrying substrate;

providing a temporary support substrate;

attaching the temporary support substrate to the second major face of the circuit carrying substrate by means of a temporary adhesive, thereby forming a first assembly;

placing the first assembly into a mold cavity such that the first assembly is located and supported in the mold cavity by the temporary support substrate;

transfer molding a plastic material about the semiconductor device and substantially all of the first major face of the circuit carrying substrate in order to form a second assembly;

removing the second assembly from the mold cavity; and removing the temporary support substrate from the circuit carrying substrate.

* * * * *

UNITED STATES PATENT AND TRADEMARK OFFICE
CERTIFICATE OF CORRECTION

PATENT NO. : 5,218,759
DATED : June 15, 1993
INVENTOR(S) : Juskey et al.

Figure 4:
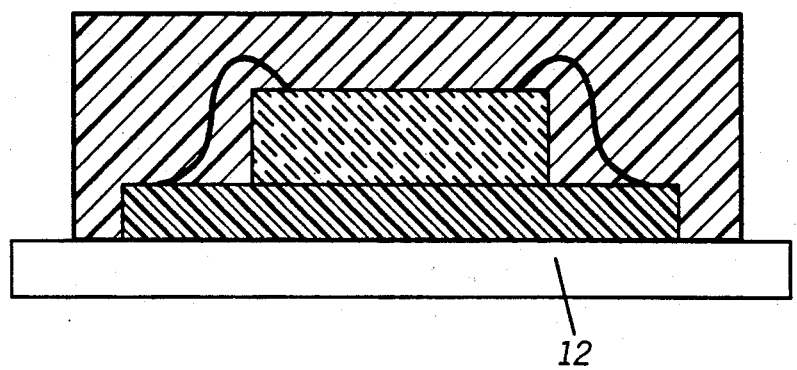
FIG. 4 is the molded assembly after removal of the temporary support substrate in accordance with the present invention.

It is certified that error appears in the above-indentified patent and that said Letters Patent is hereby corrected as shown below:

IN THE DRAWINGS:

In FIGs. 4 and 5, delete the white rectangular box labelled "12", and relocate reference numeral 12 to refer to the cross hatched rectangle directly above, so as to correspond to reference numeral 12 as used in FIGs. 1-3.

In FIG. 5, elements "50" (cross hatched semicircles, "solder bumps") should be relocated to be attached to bottom surface of element 12.

Signed and Sealed this

Twenty-second Day of March, 1994

Attest:

BRUCE LEHMAN

*Attesting Officer*   *Commissioner of Patents and Trademarks*